United States Patent [19]
Bulucea et al.

[11] Patent Number: 5,217,907
[45] Date of Patent: Jun. 8, 1993

[54] ARRAY SPREADING RESISTANCE PROBE (ASRP) METHOD FOR PROFILE EXTRACTION FROM SEMICONDUCTOR CHIPS OF CELLULAR CONSTRUCTION

[75] Inventors: Constantin Bulucea, Milpitas; Mark A. Grant, San Jose, both of Calif.

[73] Assignee: National Semiconductor Corporation, Santa Clara, Calif.

[21] Appl. No.: 826,798

[22] Filed: Jan. 28, 1992

[51] Int. Cl.$^5$ ............................................. H01L 21/66
[52] U.S. Cl. ............................. 437/8; 148/DIG. 162; 148/DIG. 135; 324/715
[58] Field of Search ................................... 437/8, 204; 148/DIG. 146, 162, DIG. 135, DIG. 974; 324/715, 719, 717, 71.5, 158 T, 158 P

[56] References Cited

U.S. PATENT DOCUMENTS

| | | | |
|---|---|---|---|
| 3,487,301 | 12/1969 | Gardner et al. | 324/719 |
| 3,676,229 | 7/1972 | Einthoven et al. | 148/DIG. 162 |
| 3,676,775 | 7/1972 | Dupnock et al. | 324/719 |
| 3,774,088 | 11/1973 | Magdo et al. | 148/DIG. 162 |
| 4,163,243 | 7/1979 | Kamins et al. | |
| 4,290,186 | 9/1981 | Klein et al. | |
| 4,413,401 | 11/1983 | Klein et al. | |
| 4,456,879 | 6/1984 | Kleinknecht | 437/8 |

FOREIGN PATENT DOCUMENTS

| | | | |
|---|---|---|---|
| 63-237538 | 10/1988 | Japan | 324/158 P |
| 1291441 | 11/1989 | Japan | 437/8 |
| 0236341 | 2/1990 | Japan | 324/71.5 |
| 2212776 | 8/1990 | Japan | 324/719 |

OTHER PUBLICATIONS

C. E. Benjamin, "Semiconductor Resistance Measuring Technique", IBM Tech. Disc. Bull., vol. 10, No. 1, Jun. 1967, p. 97.
Healy et al, "Resistance Standard", IBM Tech. Dis. Bull., 13(1), Jun. 1970, pp. 143–144.
C. Sodini et al.; Enhanced Capacitor for One-Transistor Memory Cell; IEEE Trans.; Electron Devices; ED-23, 1187 (1976).
How Big a Pattern Do We Need for Spreading Resistance Analysis?; Solecon Labs Technical Note, Jun. 7, 1990.
D. K. Schroder; Semiconductor Material and Device Characterization; Wiley, New York, (1990); pp. 23–27.
Standard Test Method for Measuring Resistivity Profiles Perpendicular to the Surface of a Silicon Wafer Using a Spreading Resistance Probe; 1988 Annual Book of ASTM Standards, American Soc. of Test. Mater. Conf., Philadelphia, (1988).
R. Brennan et al.; Determination of Diffusion Characteristics Using Two- and Four-Point Probe Measurements; Solid-State Technology, 27, 125, (1984).
R. J. Hilliard et al.; Profiling of Silicon and III–V Compounds by Point Contact Technologies: Solid-State Technology; 32, 119 (1989).
J. R. Ehrstein; Spreading Resistance Measurements—An Overview; Emerging Semiconductor Technologys—, ASTM STP 960; Test. Mater. Conf. Philadelphia (1986).
S. C. Choo et al.; Extraction of Semiconductor Dopant Profiles from Spreading Resistance Data: An Inverse Problem; Solid-State Electronics, 33, 783, (1990).
R. G. Mazur et al.; "A Spreading Resistance Technique for Resistivity Measurements on Silicon"; J. Electrochem Society,113, 255, (1966).

*Primary Examiner*—Brian E. Hearn
*Assistant Examiner*—Michael Trinh
*Attorney, Agent, or Firm*—Michael J. Pollock

[57] ABSTRACT

A method of extracting an impurity profile from a diced semiconductor chip having cellular construction. The cells are arranged in a matrix the columns and rows of which have a defined column pitch $a_x$ and a defined row spacing $a_y$. In accordance with the method, the diced chip is bevelled from its original surface to expose the cells. The two probes of a Spreading Resistance Profile (SRP) device are then placed in contact with the dopant regions of two cells in the same row of the matrix, the distance $\Delta X$ between the probes being $ma_x$, where m is an integer, and the total resistance $R_T$ between the probes is measured. The SRP device is then stepped through a plurality of rows in the matrix, contacting cells in the same two columns as in the case of the first measurement, thereby interactively generating a plurality of total resistance $R_T$ measurements. The total resistance $R_T$ measurements are then combined to obtain the doping profile of the dopant region.

6 Claims, 8 Drawing Sheets

ARRAY SPREADING RESISTANCE PROBE (ASRP) METHOD FOR PROFILE EXTRACTION FROM SEMICONDUCTOR CHIPS OF CELLULAR CONSTRUCTION

BACKGROUND OF THE INVENTION

1. Field of the Invention

The present invention relates to probing and analysis of semiconductor integrated circuits and in particular, to a method of extracting dopant profiles from cellular semiconductor structures.

2. Discussion of the Prior Art

Extraction of doping profiles from specified areas of semiconductor devices is a rather difficult task when the devices are only available in the form of individually diced semiconductor chips. Typically, such a task is encountered in the analysis of a given competitor sample, for example, for purposes of determining patent infringement, or in obtaining reference data for new process development.

Of the profiling techniques applicable to undiced semiconductor wafers, the most commonly used is the Spreading Resistance Probe (SRP) method. See R. G. Mazur and D. H. Dickey, "A Spreading Resistance Technique for Resistivity Measurements in Si", *J. Electrochem. Soc.*, 113, 255 (1966). The Mazur/Dickey SRP method requires the wafer to have specially devised rectangular patterns of 1,000 $\mu$m $\times$ 100 $\mu$m (preferred dimensions), or at least 200 $\mu$m $\times$ 40 $\mu$m. See "How Big a Pattern Do We Need for Spread Resistance Analysis", Solecon Labs Technical Note, Jun. 7, 1990.

Unfortunately, the conventional SRP method cannot be applied to diced semiconductor structures, except for non-cellular, large-area power devices such as high-current diodes and thyristors.

THE CONVENTIONAL SRP METHOD

The conventional SRP method is described in various reference works. See for example: D. K. Schroder, *Semiconductor Material and Device Characterization*, Wiley, New York (1990); ASTM Standard F672 "Standard Method for Measuring Resistivity Profile Perpendicular the Surface of a Silicon Wafer Using a Spreading Resistance Probe", 1988 *Annual Book of ASTM Standards*, American Soc. of Test. Mater. Conf., Philadelphia (1988); R. Brennan and D. Dickey, "Determination of Diffusion Characteristics Using Two-and Four-Point Probe Measurements", *Solid-State Technology*, 27, 125 (1984); and R. J. Hillard, R. G. Mazur, H. L. Berkovits, and P. Rai-Choudhury, "Profiling of Silicon and III-IV Compounds by Point-Contact Techniques", *Solid-State Technology*, 32, 119 (1989).

Figure 1:
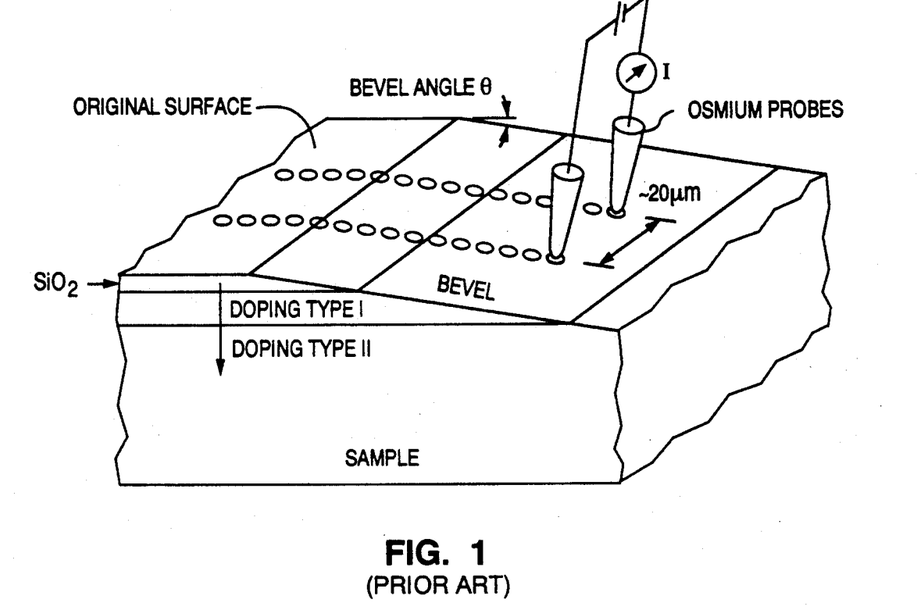
FIG. 1 provides an overall illustration of the conventional two-point SRP measurement technique on a bevelled surface.
Figure 2:
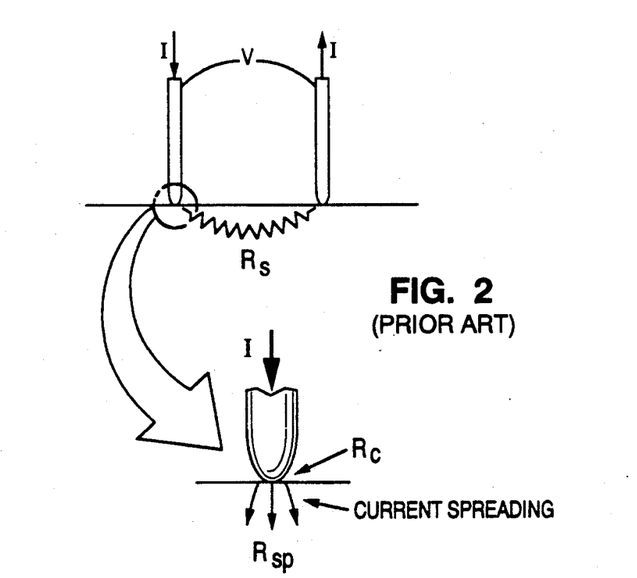
FIG. 2 provides a detailed illustration of the FIG. 1 measurement technique.

As shown generally in FIG. 1, and in greater detail in FIG. 2, the conventional SRP method uses a two-point resistance measurement on a bevelled surface. The total resistance $R_T$ measured between the probes has several components, i e., $$R_T = 2R_c + 2R_{sp} + R_s \sim 2R_{sp}, \tag{1}$$

where $R_c$ is the contact resistance, $R_{sp}$ is the spreading resistance and $R_s$ is the semiconductor resistance between the probe contacts. The spreading resistance $R_{sp}$ accounts for the resistance encountered by the current I when it flows from the metal probe into the semiconductor material.

For analytical purposes, the probe can be approximated as a highly conductive, cylindrical bar that is placed into non-indenting contact with a semi-infinite semiconductor block. It has been demonstrated (see Hillard et al., Ibid) that such an arrangement yields a spreading resistance $$R_{sp} = \rho/(4r), \tag{2}$$

where $\rho$ is the semiconductor resistivity and r is the probe radius.

It can easily be seen that if the probe radius r is made small enough and the contact resistance $R_c$ is minimized, then the spreading resistance $R_{sp}$ becomes the dominant component of the total resistance $R_T$, as reflected in Eq. (1). Moreover, about 80% of the potential drop due to the spreading phenomenon occurs within a distance of five times the contact radius, which makes the SRP method a good tool for local resistivity characterization.

The application of this method to actual resistivity measurements involves complex calculations, the result of which is a multiplicative correction factor to Eq (2). Furthermore, application of the method to non-uniform doping profiles involves mathematical and physical analysis making up a specialized literature that has been generated by a confined circle of authors. See, for example, J. R. Ehrstein, "Emerging Semiconductor Technology", ASTM STP 960 (Edited by D. C. Gupta and P. H. Langer), American Soc. Test. Mater. Conf. Philadelphia (1986); and S. C. Choo, M. S. Leong, C. B. Liem and K. C. Kong, "Extraction of Semiconductor Dopant Profiles from Spreading Resistance Data: An Inverse Problem", *Solid-State Electronics*, 33, 783, (1990).

Most recently, space-charge effects have been observed to influence SRP measurements (specifically in deep profiles). These effects are accounted for utilizing advanced simulation tools. See W. B. Grabowski, "Simulation of SRP Bevel Effects", Application Note 1001, Technology Modeling Associates, Inc., Palo Alto (1986).

The following quantitative aspects of the conventional SRP method are also important when attempting to apply the method to diced semiconductor chips. First, the probes are typically made from osmium and/or tungsten at tip radiuses of several micrometers. This does not pose a significant limitation on the ultimate level of measurement localization achievable by the SRP technique. Second, the probe spacing is generally adjustable between 10 and 20 $\mu$m. This does not severely limit application of the method to diced chips. Third, the bevel angle $\Theta$ is typically between 0.2° (shallow profiles) and 5° (deep profiles) and the horizontal stepping distance is in the range of 5 $\mu$m. The vertical stepping increment $\Delta Z$ is $$\Delta Z = \Delta Y \sin \Theta \tag{3}$$

where $\Delta Y$ is the horizontal stepping distance. Therefore, the measurement target required by the conventional SRP method should have a total length Y in excess of 115 $\mu$m for a typical 2 $\mu$m deep profile ($Z=2$ $\mu$m) bevelled at an angle of 0.5°. Since the total length of many commercially-available semiconductor chips is within this order of magnitude, the standard SRP method is restricted from application to diced chips, except for non-cellular large-area power devices.

As a combined result of the above quantitative aspects, the conventional SRP method has severe limitations at die-level application, in spite of its ultimate localization capabilities.

CELLULAR DEVICE STRUCTURES

Cellular device structures are defined as arrays of identical small-area devices, called microcells, or, simply, cells, the electrodes of which are connected in parallel. Each cell includes several different doping profiles.

Figure 3:
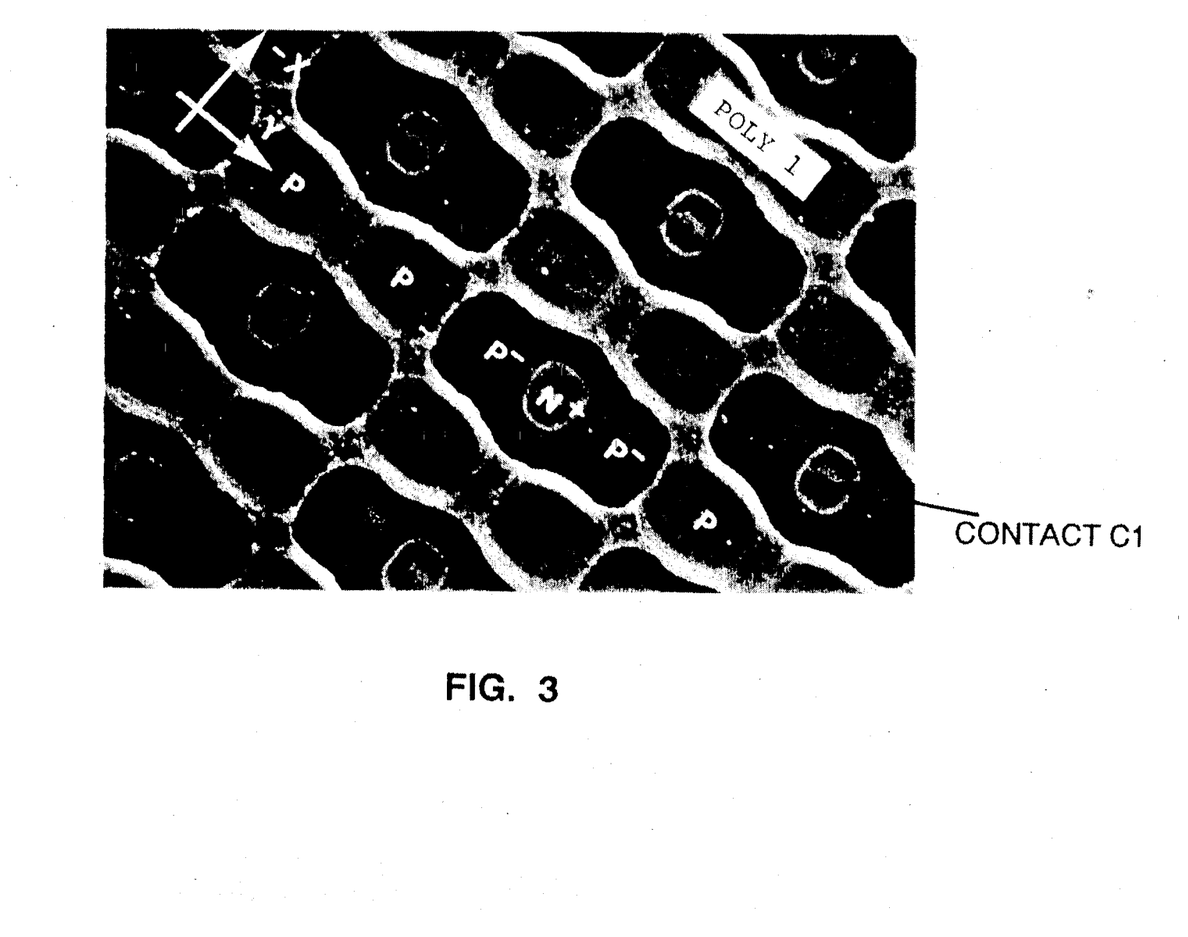
FIG. 3 is a scanning electron microscope, (SEM) photograph showing an array of DRAM cells belonging to a 1 Mbit DRAM that has been deprocessed down to silicon.

A typical class of cellular device structures comprises the semiconductor memories of various functional types, such as DRAM, SRAM, PROM, etc. FIG. 3 shows an array of DRAM cells belonging to a 1 Mbit DRAM device that has been deprocessed down to poly-1 layer (grounded capacitor plate). Q and C denote the transistor and capacitor areas, respectively. Each DRAM cell is 3.25 $\mu m \times 7.50$ $\mu m$; the array extends over an area of 5 mm $\times$ 10 mm.

Figure 4:
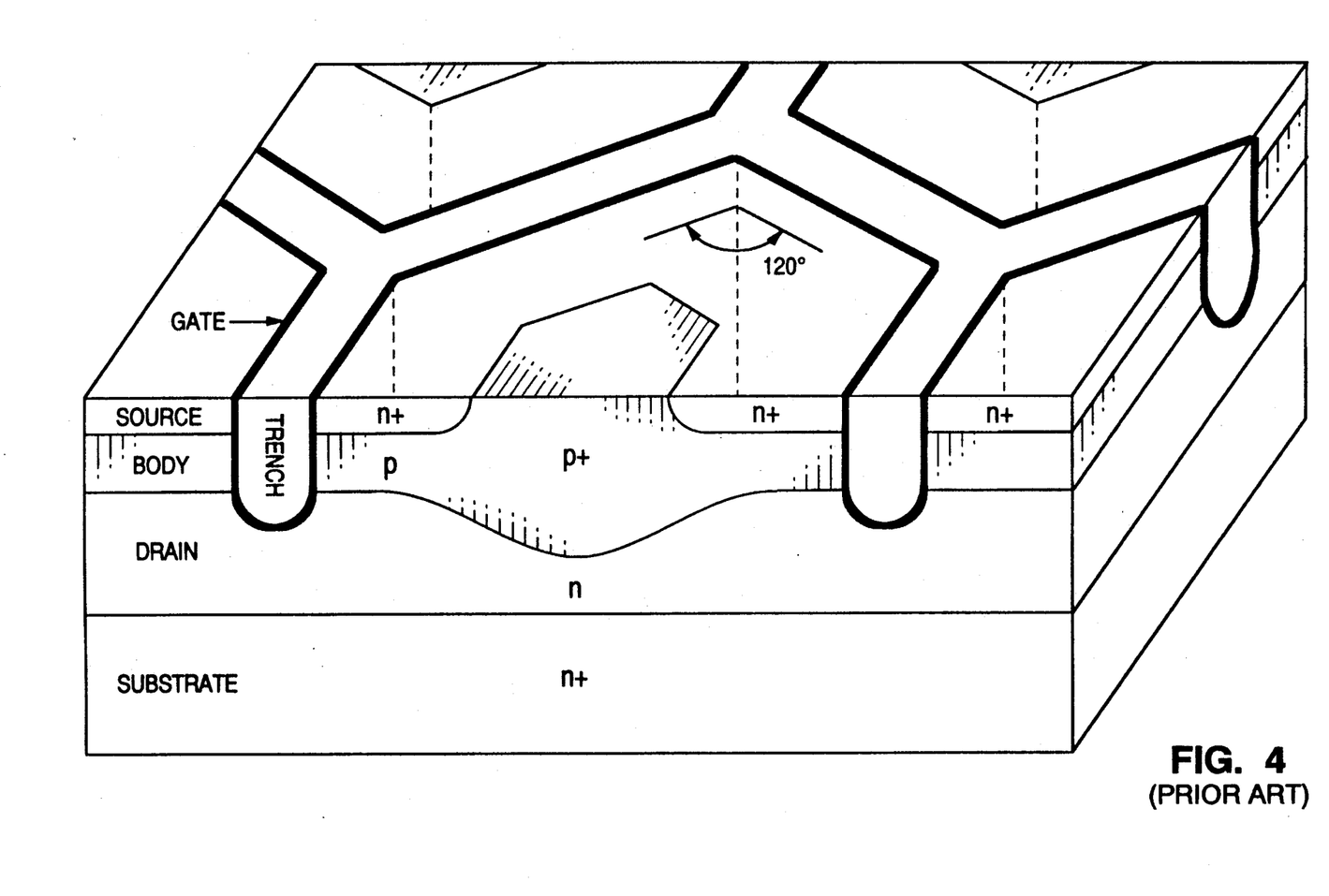
FIG. 4 is a cross-sectional perspective view illustrating a hexagonal cell from a 150 A power trench DMOS transistor.

Another class of cellular device structures comprises power DMOS transistors. FIG. 4 shows a hexagonal cell from a 150 A power trench DMOS transistor. This cell is about 12 $\mu m$ in diameter and the array contains about 350,000 such cells concatenated over a near-square die. See C. Bulucea and A. Rossen, "Trench DMOS Transistor Technology for High-Current (100 A range) Switching", *Solid-State Electronics,* 34 (1991). The cellular construction of power DMOS transistors stems from the requirement of maximizing the total source perimeter in a given die area.

Yet another class of cellular devices comprises power bipolar transistors designed as multi-emitter arrays for minimizing high-current emitter crowding effects.

All of the above-mentioned examples of cellular structures involve cell dimensions that are compatible with the micronic size of the probe tips in current use in conventional SRP methodologies. Also, the total array dimensions are compatible with the SRP target sizes required for wafer SRP measurements.

Other techniques for extracting dopant profile are also available. The closest to satisfying the small-area requirements is the Secondary-Ion Mass Spectroscopy (SIMS) technique. See S. M. Sze, *VLSI Technology,* McGraw-Hill, New York, 1988. Although, theoretically, the ion-beam spot could be confined to a few micrometers in diameter, the SIMS method appears to be impractical and cost-inefficient under normal conditions. Moreover, the presence of the same doping element, i.e., boron, in the field regions (under the field oxide) poses serious discrimination problems if the ion-beam spot intrudes into the respective regions.

It appears that no practical method is currently available for the extraction of impurity profiles from individual semiconductor device chips. Hence, the new Array SRP technique described below provides a practical possibility for accomplishing the stated task.

SUMMARY OF THE INVENTION

The present invention provides a method of extracting an impurity profile from a diced semiconductor chip having cellular construction. That is, the cells are arranged in a matrix the columns and rows of which have a defined column pitch $a_x$ and a defined row spacing $a_y$. In accordance with the method, the diced chip is bevelled from its original surface to expose the cells at different depths into silicon. The two probes of a Spreading Resistance Profile (SRP) device are then placed in contact with the dopant regions of two cells in the same row of the matrix, the distance $\Delta X$ between the probes being $ma_x$, where m is an integer, and the total resistance $R_T$ between the probes is measured. The SRP probe is then stepped through a plurality of rows in the matrix, contacting cells in the same two columns as in the case of the first measurement, thereby generating a plurality of total resistance $R_T$ measurements. Because the chip is bevelled, the sequential measurements are stepped a constant vertical distance into the profile of each cell. The total resistance $R_T$ measurements for each cell in the sequence are then combined to obtain the doping profile of the dopant region for the cell.

The new method relaxes the requirement on the minimum SRP target length by roughly a factor of 100. The feasibility of the new method has been demonstrated on memory chips, where the presence of p/p− enhanced-capacitor profiles has consistently been revealed, with practically no additional costs compared to a standard SRP measurement. The new method is utilizable in process analysis tasks when only diced chips are available. The method is by no means intended to replace, or to compete in accuracy with, the standard SRP method, when continuous, large-area SRP targets are available for probing. However, the Array SRP method offers the ultimate confirmation on the existence of a given profile inside actual devices and offers a valuable instrument for assessing the overall consistency and quality of a complex process. Compared with other potentially applicable, but not yet demonstrated methods, such as secondary-ion mass spectroscopy, the method of the present invention is at least 10 times cheaper and is readily available throughout the semiconductor industry at no additional development cost.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

The present invention provides an alternate SRP method, called Array SRP (ASRP), that is applicable to diced semiconductor chips having cellular construction. A cellular construction is typically encountered in memory devices or in cellular power transistors (high-current bipolar transistors, DMOS field-effect transistors), where an individual cell has linear dimensions in the range of several micrometers and the array extends over several millimeters in both the "x" and "y" directions.

I. The Array SRP Method

A) Ideal Case - Stepping Distance Adjustable to Cell Pitch

Figure 5:
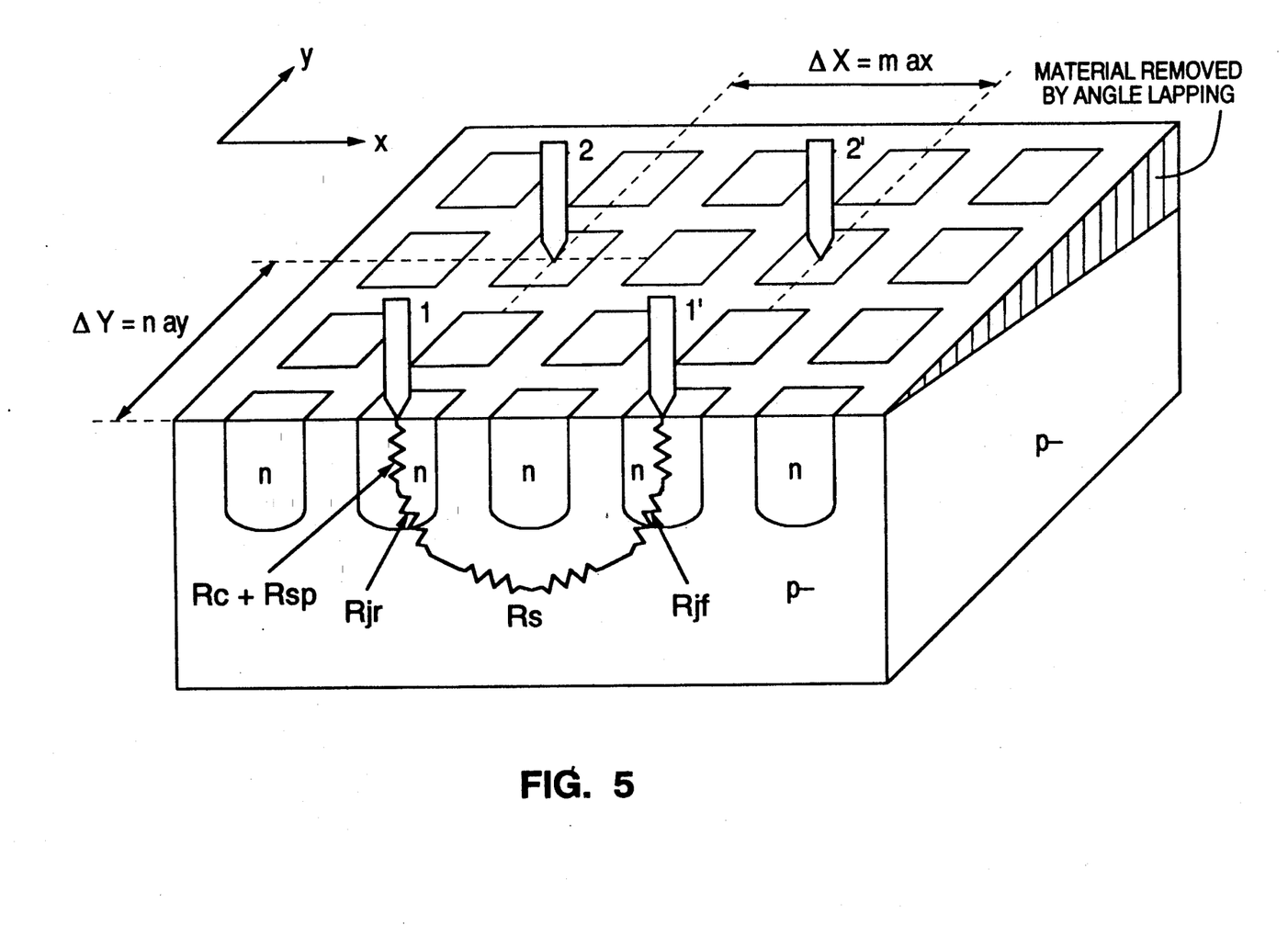
FIG. 5 is a cross-sectional perspective view illustrating an Array SRP method in accordance with the present invention, utilizing a simple n-p−/cell structure for illustration.

In accordance with the present invention, the conventional SRP method is modified such that each probe step, and the corresponding measurement reading, is taken from a different cell of similar construction, as shown in FIG. 5. All readings combine into a consistent profile, since cells are identical by construction. Note that the probe spacing $\Delta X$ and the probe horizontal stepping distance $\Delta Y$ are assumed to be multiples of the cell pitch dimensions $a_x$ and $a_y$, respectively. That is, $$\Delta X = m a_x; \quad \Delta Y = n a_y; \quad m, n = \text{small integers}. \tag{4}$$

The total resistance measured between the probes is $$R_T = 2R_c + 2R_{sp} + R_{jr} + R_{jf} + R_s, \tag{5}$$

where $R_{jf}$ and $R_{jr}$ are the resistances along the current path associated with the forward and reverse-biased junctions, respectively.

The junction resistances $R_{jf}$ and $R_{jr}$ apparently interfere with the basic measurement. However, they can be made negligible, in comparison with the spreading resistance $R_{sp}$, by the customary application of small voltages of the order of 5 mV.

For applied voltages that are less than $KT/q \approx 25$ mV, the I-V characteristics of the junctions, as well as of the metal-semiconductor contacts, are linear. Therefore, with the standard assumption that the spreading resistance $R_{sp}$ is dominant in comparison with the series resistance $R_s$, the Array SRP technique results in essentially the same profile that would be obtained from probing over a continuous SRP target.

Although complex data reduction procedures can be generated that introduce various current constriction corrections, it is recommended that no correction be introduced, other than those ordinarily used for continuous targets of similar profiles. Those skilled in the art will realize that, in doing so, this method provides only first-order information on a given device sample and is does not need to be as accurate as an SRP profile based on continuous target measurements.

B) Less-Than-Ideal Case - Fixed Stepping Distance

If the stepping distance is not adjustable, e.g. it is fixed to 5 µm from the construction of the SRP apparatus, then the probes will land only periodically over the intended profile targets. Outside these periodic situations, the probes will land over different areas, resulting in erroneous readings that need to be eliminated.

The inadjustability of the stepping distance imposes a limitation on the range of structures that can be investigated with this method, in the sense that the profile to be extracted must extend over a predominant portion of the cell in the direction of probe stepping. Such a situation is met, for example, in DRAMs, where the capacitor portion of the cell occupies about 50% of the cell length.

II. Experimental Results

Several samples of 256 Kbit and 1 Mbit DRAM devices were utilized for demonstrating the viability of the above-described Array SRP method, the specific task having been to detect the presence of a p/p− dopant profile in the construction of the individual DRAM cells.

Figure 6A:
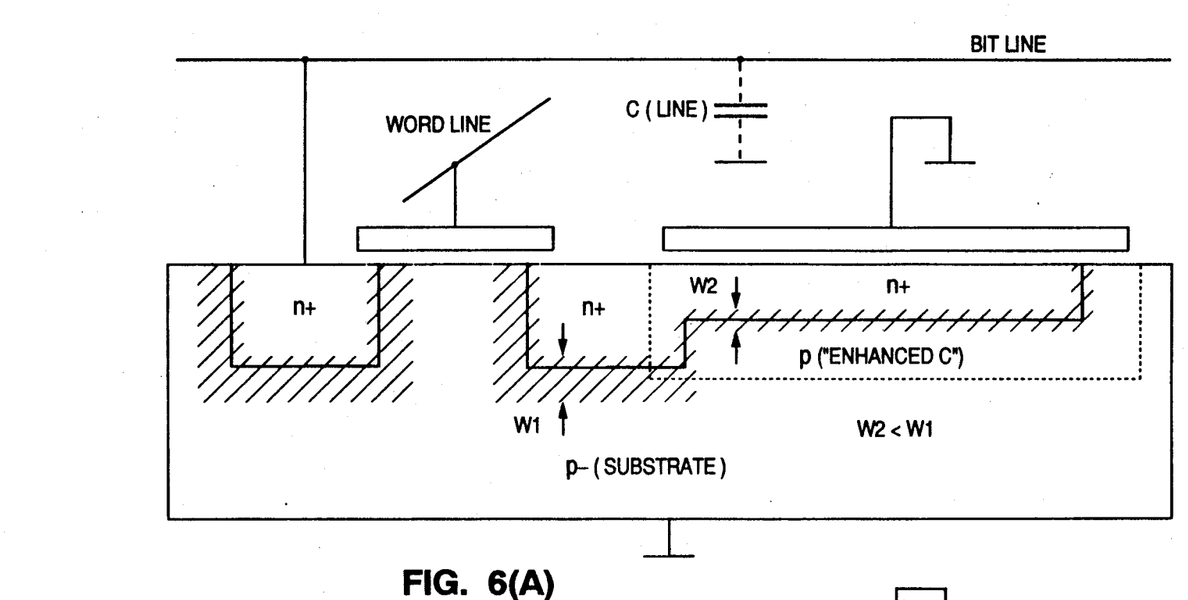
FIG. 6 illustrates a p/p−/profile in a conventional single-transistor DRAM cell.
Figure 6B:
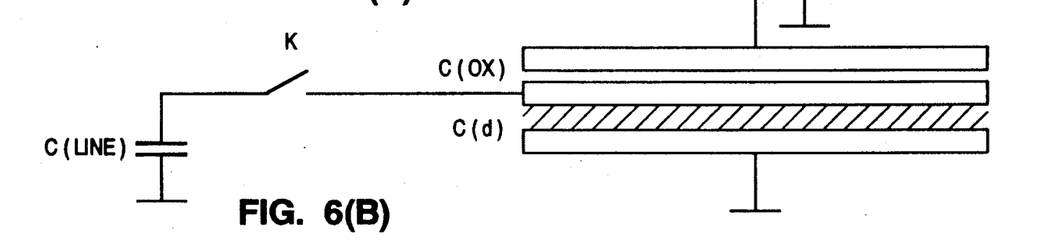
Figure 7:
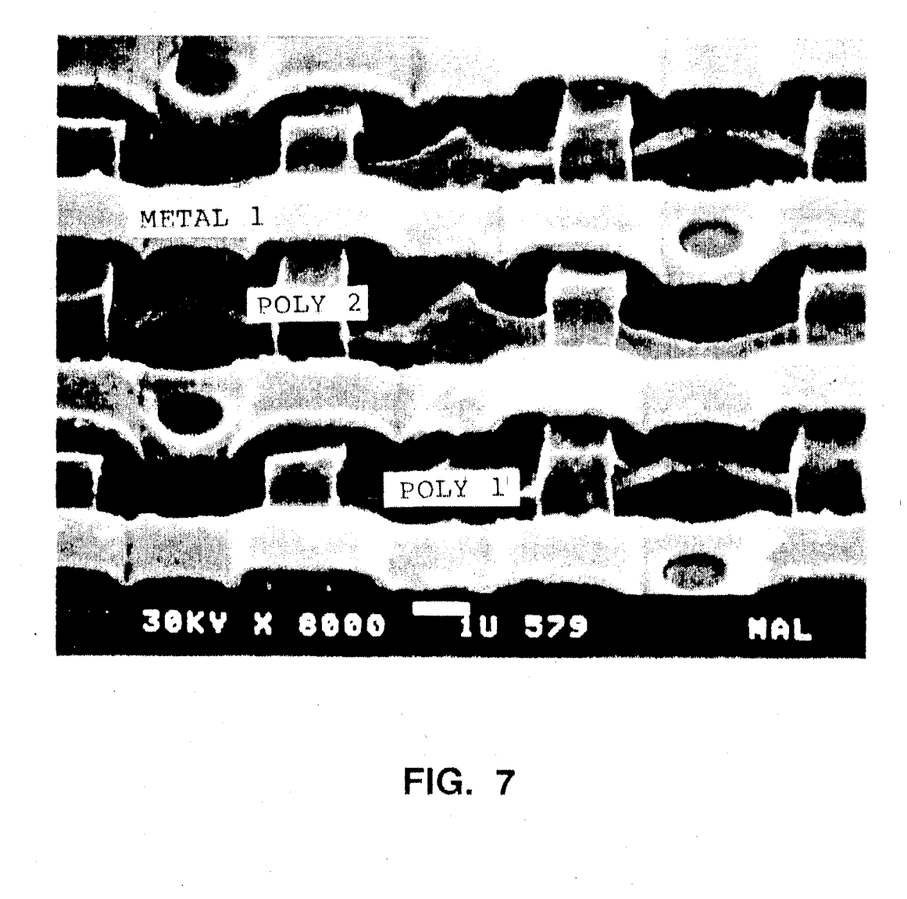
FIG. 7 is a SEM photograph of an array of DRAM cells of the type shown in FIG. 6 after stripping the Metal 2 layer.

These memories are typically made with a double-poly, double-metal process and utilize the typical single-transistor cell shown in FIGS. 6(a) and 6(b). The array construction is shown in FIG. 7, where the bit lines are Metal 1, the word lines are Poly 1 and the grounded capacitor plates are Poly 2. A view of the array deprocessed to silicon is shown in FIG. 3.

Referring to FIG. 6(a), W1 and W2 represent the depletion layer widths of n+/−p junctions built in original and p-doped substrates, respectively. FIG. 6(b) shows a simplified representation of the cell structure, where c(line) is the bit-line capacitance, and C(ox) and C(d) are the oxide and depletion-layer capacitances, respectively.

The p/p− dopant profile to be detected is located under the plate of oxide capacitor C(ox). This profile enhances the total capacitance of the cell, C(ox)+C(d), by reducing the thickness of the depletion region associated with the junction capacitor C(d) as disclosed in U.S. Pat Nos. 4,290,186; 4,413,401 and 4,163,243 and by C. G. Sodini and T. I. Kamins, "Enhanced Capacitor for One-Transistor Memory Cell", IEEE Trans. *Electron Devices*, ED-23, 1187 (1976).

The SRP measurements and data processing were done at Solecon Laboratories, San Jose, Calif., using conventional, state-of-the-art equipment and doping extraction programs. The adjustable probe spacing was first set to $\Delta X = 2a_x$ and the array was stepped along the y-direction (see FIG. 3) at the machine's fixed stepping distance of $\Delta Y = 5 \mu m$.

In a first experiment, the chips were stripped down to silicon, then angle-lapped at 0.26° (0.0045 radians) and measured.

In a second experiment the chips were stripped of the metal layers only, then angle-lapped through the poly-/oxide layers and measured under identical conditions. No reportable difference was observed between the results of these two experimental procedures. This proved that any possible influence of the p+ isolation implant present under the array field oxide was insignificant.

Essentially the same results were obtained when the probe spacing was changed from $\Delta X = 2a_x$ to $\Delta X = 3a_x$, thus proving that the possible interference from the n+-p− source/drain junctions present in the array was not serious.

Figure 8:
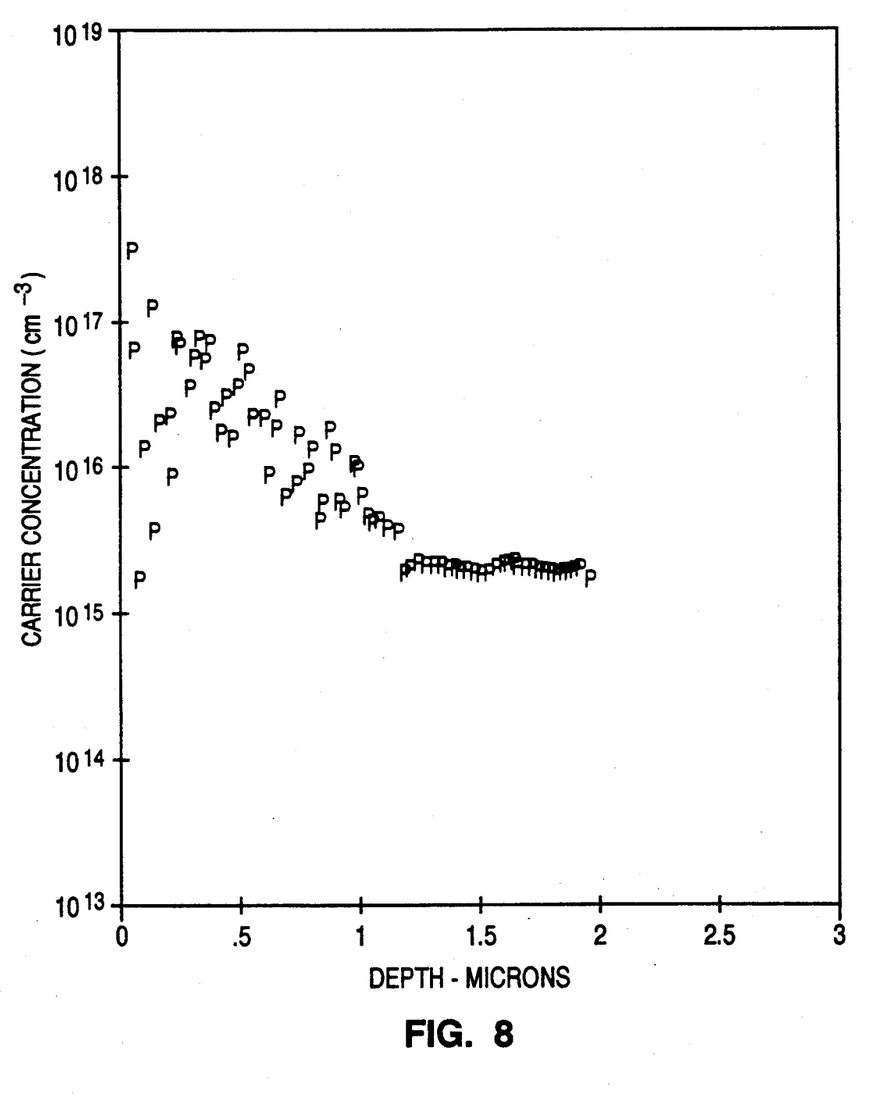
FIG. 8 is a graph illustrating raw data of a carrier concentration profile under the capacitor plate of a 1 Mbit memory obtained utilizing an Array SRP method in accordance with the present invention.
Figure 9:
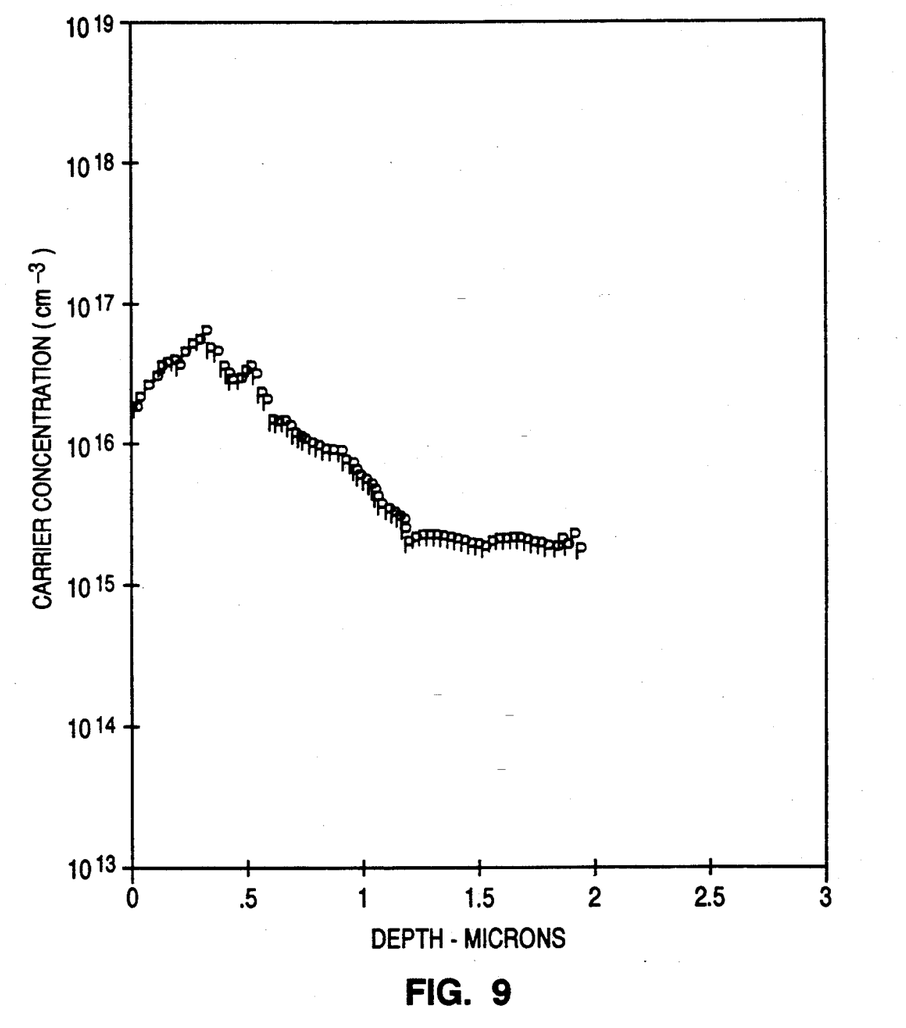
FIG. 9 is a graph illustrating filtered data from the FIG. 8 graph.

The raw measurement results are shown in FIG. 8. These results were subsequently subjected to a filtering process that eliminated the obviously erroneous points. The points eliminated were replaced by points determined from a parabolically fitted curve of the remaining points, resulting in the plot of filtered data shown in FIG. 9.

The doping levels revealed by these determinations are fully compatible with standard industry usage. Also, the retrograde aspect, towards the surface of the boron profile is consistent with the magnitude of the implantation energies in customary use. The data points belonging to the shallow n+-p capacitor junction, not represented in the FIG. 9 measurements, are assumed to have been eliminated as spurious p-type points during the data filtering process, where the p nature of the profiles was determined by independent hot-probe measurements. (see D. K. Schroder, Ibid).

In all experiments, the extraction of the doping profiles from the measured resistivity profiles was done using the standard algorithms and computer programs in current use for continuous (i.e., non-arrayed) measurement targets.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method of extracting an impurity profile from a diced semiconductor chip that has a matrix of device cells formed therein, each cell having a substantially-identically-constructed dopant region formed therein, the matrix being arranged as parallel rows and columns of said cells such that adjacent columns have a defined column pitch $a_x$ and adjacent rows have a defined row spacing $a_y$, the method comprising the steps of:

(a) bevelling the semiconductor chip from its original surface to expose the dopant regions of said cells such that the same point in the dopant region of cells of adjacent rows is at differing depths;

(b) placing the two probes of a SRP device in the dopant region of first and second measurement cells in the same row of the matrix such that the distance $\Delta X$ between the probes is $ma_x$, where m is an integer;

(c) measuring the total resistance $R_T$ between the two probes;

(d) stepping the SRP device through a series of rows of the matrix to contact two cells in the same column as the first and second measurement cells, the stepping distance $\Delta Y$ in each case being $na_y$, where n is an integer.

whereby the bevelling of the chip causes the SRP probes to contact a different point in the y direction in the dopant region of cells in different rows;

(e) taking a total resistance $R_T$ measurement at each step of the SRP device; and (f) combining the plurality of total resistance measurements to obtain a doping profile of the dopant region.

2. A method as in claim 1 wherein the bevelling and the stepping are done in the x direction.

3. A method as in claim 1 wherein the bevelling and the stepping are done at a predetermined angle from the y direction.

4. A method as in claim 1 wherein the stepping distance differs from $n\,a_y$ and including the further step of filtering the dopant profile to eliminate obviously erroneous data.

5. A method as in claim 4 wherein the bevelling and the stepping are done in the x direction.

6. A method as in claim 4 wherein the bevelling and the stepping are done at a predetermined angle from the y direction.

* * * * *